US010636955B2

(12) United States Patent
Walker

(10) Patent No.: US 10,636,955 B2
(45) Date of Patent: Apr. 28, 2020

(54) TERAHERTZ TRANSISTOR

(71) Applicant: Arizona Board of Regents on Behalf of University of Arizona, Tucson, AZ (US)

(72) Inventor: Christopher K. Walker, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 15/600,036

(22) Filed: May 19, 2017

(65) Prior Publication Data

US 2017/0338396 A1 Nov. 23, 2017

Related U.S. Application Data

(60) Provisional application No. 62/339,384, filed on May 20, 2016.

(51) Int. Cl.
*H01L 39/12* (2006.01)
*H03K 19/195* (2006.01)
(Continued)

(52) U.S. Cl.
CPC ............ *H01L 39/146* (2013.01); *H01L 39/12* (2013.01); *H01L 39/148* (2013.01); *H01L 39/18* (2013.01);
(Continued)

(58) Field of Classification Search
CPC ........ H01L 2924/0002; H01L 2924/00; H01L 23/5228; H01L 23/5223; H01L 28/20;
(Continued)

(56) References Cited

U.S. PATENT DOCUMENTS 6,709,918 B1 * 3/2004 Ng ..................... H01L 23/5223
257/E21.004
6,988,058 B1 * 1/2006 Sherwin ................ B82Y 10/00
703/1

(Continued)

FOREIGN PATENT DOCUMENTS

EP 2945160 B1 * 3/2017 ............. G11C 11/44

OTHER PUBLICATIONS

"Cooper Pair Breakup [ . . . ] under Strong Terahertz Fields A. Glossner, Erlangen, Germany (Dated: May 9, 2012)".*

(Continued)

*Primary Examiner* — Edward Chin
(74) *Attorney, Agent, or Firm* — Blank Rome LLP

(57) ABSTRACT

Superconducting Meissner effect transistors, methods of modulating, and systems are disclosed. In one aspect a disclosed transistor includes a superconducting bridge between a first and a second current probe, the first and second current probe being electrically connected to a source and a drain electrical connection, respectively and a control line configured to emit a magnetic field signal having signal strength $H_{sig}$ at the superconducting bridge. In one aspect the emitted magnetic field is configured to break Cooper pairs in the superconducting bridge.

24 Claims, 16 Drawing Sheets

Example MET amplifier implemented in a waveguide mount.

(51) Int. Cl.
*H03K 19/20* (2006.01)
*H01L 39/18* (2006.01)
*H01L 39/14* (2006.01)
*H03B 15/00* (2006.01)

(52) U.S. Cl.
CPC ......... *H03B 15/003* (2013.01); *H03K 19/195* (2013.01); *H03K 19/20* (2013.01)

(58) Field of Classification Search
CPC ... H01L 28/40; H01L 21/31687; H01L 22/20; H01L 23/53228; H01L 27/016; H01L 27/0802; H01L 27/0805; H01L 29/7833; H01L 21/02; H01L 21/302; H01L 21/70; H01L 21/768; H01L 23/52; H01L 23/522; H01L 23/532; H01L 29/02; G06K 19/00; H03B 5/12; H03K 3/36; H04B 1/04; H04B 7/24

See application file for complete search history.

(56) References Cited

U.S. PATENT DOCUMENTS

| | | | | |
|---|---|---|---|---|
| 8,367,514 | B2* | 2/2013 | Goebel | H01L 21/31687 438/396 |
| 8,723,205 | B2* | 5/2014 | Ramer | H01L 33/50 165/104.19 |
| 2004/0238962 | A1* | 12/2004 | Jung | H01L 23/5228 257/758 |
| 2010/0295661 | A1* | 11/2010 | Subramanian | G06K 7/0008 340/10.1 |
| 2013/0182464 | A1* | 7/2013 | Woias | H02M 3/33507 363/21.17 |
| 2013/0234292 | A1* | 9/2013 | Wei | H01L 23/5228 257/536 |
| 2014/0113828 | A1* | 4/2014 | Gilbert | H01L 39/126 505/100 |

OTHER PUBLICATIONS

"Evidence for two-dimensional Ising superconductivity in gated MoS2 J. M. Lu".*

D. J. Griffiths, et al., "Introduction to Electrodynamics", Prentice Hall, 1981, 596 pgs.

J. Millman, Ph.D., et al., "Integrated Electronics: Analog and Digital Circuits and Systems", Tata McGraw-Hill Publishing Company Limited, 2000, 926 pgs.

C. Kittel, "Introduction to Solid State Physics", Eight Edition, John Wiley & Sons, Inc., 2005, 703 pages.

A. M. Kadin, "Introduction to Superconducting Circuits", http://hdl.handle.net/2027/mdp.39015047519007; John Wiley & Sons, Inc., 1999, 409 pgs.

T. Ohashi, et al., "Dynamic Fluctuations in the Superconductivity of NbN Films from Microwave Conductivity Measurements", arXiv:cond-mat/0605179v1 [cond-mat.supr-con], May 8, 2006, 8 pages.

D. Karecki, et al., "Far-infrared Transmission of Superconducting Homogeneous NbN Films: Scattering Time Effects", *Physical Review B*, vol. 25, No. 3, Feb. 1, 1982, pp. 1565-1571.

M. V. Ramallo, et al., "Relaxation Time of the Cooper Pairs Near $T_c$ in Cuprate Superconductors", *Europhysics Letters*, vol. 48, No. 1, Oct. 1, 1999, pp. 79-85.

* cited by examiner

Superconducting bridge coordinate system $\delta$ is the bridge thickness.

Small signal equivalent circuit for an example MET.

Example MET Source Drain Characteristic.

MET magnetic drain resistance as a function of applied field.

MET amplification factor versus $H_a/H_c$ for various values of $V_{DS}$.

Example schematic of MET amplifier with negative feedback

Example implementation of MET amplifier with negative feedback

Example MET amplifier implemented in a waveguide mount.

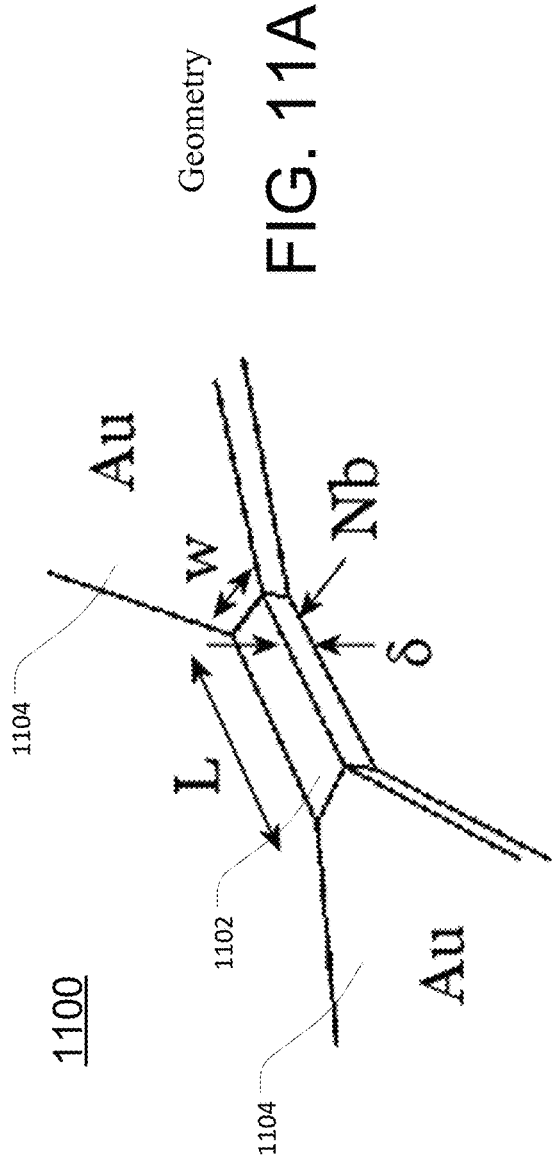
FIG. 11A
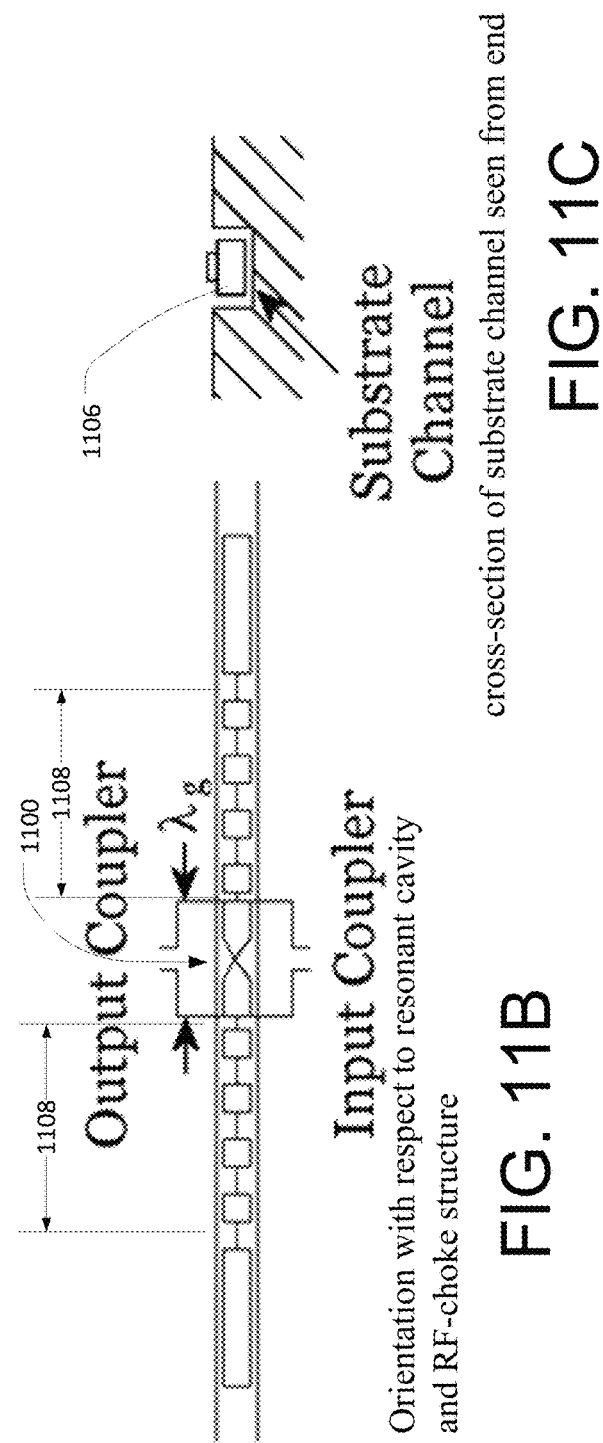
FIG. 11B
FIG. 11C

Example MET operation

MET's can be configured to create any classic logic gate known in the art.
Shown here is an example "OR" gate.

TERAHERTZ TRANSISTOR

This application claims priority under 35 U.S.C. § 119(e) to U.S. provisional patent application 62/339,384 filed on May 20, 2016, which is hereby incorporated by reference in its entirety herein.

BACKGROUND

Terahertz radiation covers a range of frequencies between the infrared and microwave portions of the spectrum. Like other frequency ranges, there are applications suited to the use of Terahertz radiation. The small size of Terahertz waves (sub-millimeter) coupled with bio-safety enables viewing objects in fine detail for security, radar, and medical applications. The related high frequency provides high bandwidth for telecommunications. And the Terahertz band enables sensing elements that emit radiation in that range. The ability to more effectively generate and sense Terahertz waves is an ongoing technical challenge to developing products for these applications. Transistors that operate in the Terahertz frequency make that possible.

Furthermore, computer performance is currently lacking improved performance. Because of the heat produced by running at the higher frequencies needed for improved performance, traditional silicon computer chips long ago reached their limit in the Gigahertz range (1,000 times slower than Terahertz). Therefore, there is a need for improved transistors capable of efficiently operating at higher frequencies and/or lower power.

SUMMARY

The described embodiments alleviate the problems of the prior art and provide improved transistors and other applications capable of efficiently operating at higher frequencies and/or lower power.

In one aspect a disclosed superconducting Meissner effect transistor (MET) includes a superconducting bridge between a first and a second current probe, the first and second current probe being electrically connected to a source and a drain electrical connection, respectively. In another aspect a control line is configured to emit a magnetic field signal having signal strength $H_{sig}$ at a superconducting bridge, wherein the emitted magnetic field is configured to break Cooper pairs in a superconducting bridge. In another aspect breaking Cooper pairs in a superconducting bridge decreases conductivity of a superconducting bridge. And in yet another aspect of the disclosed examples, a magnetic field bias is provided, where a strength of the magnetic field bias at a superconducting bridge ($H_a$) is less than or equal to a critical field value ($H_c$) for the superconducting bridge.

In one aspect of the disclosure $H_a$ is less than or equal to the magnitude of $H_{sig}$ subtracted from $H_c$. In another aspect of the disclosure, $H_{sig}$ is a time varying magnetic field having a maximum strength of $H_{sig-max}$ and a minimum strength of $H_{sig-min}$. In another aspect of the disclosure $H_a$ is less than or equal to the magnitude of $H_{sig}$ subtracted from $H_c$. And in yet another aspect of the disclosure, a superconducting bridge is formed including a type I superconductor. In one particular aspect of the disclosure, a superconducting bridge is formed including a type II superconductor and $H_c$ is equal to $H_{c1}$ and $H_{c1}$ is a strength of the magnetic field at the superconducting bridge at an onset of a mixed state of superconductivity for the superconducting bridge.

In one aspect of the disclosure, a superconducting bridge has a temperature that is less than or equal to its critical temperature. In another aspect of the disclosure, a superconducting bridge includes niobium. In yet another aspect a superconducting bridge is a temperature that is less than or equal to its critical temperature ($T_c$) and greater than or equal to about 0.2K, is less than or equal to its critical temperature ($T_c$) and greater than or equal to about 2.2K, is less than or equal to its critical temperature ($T_c$) and greater than or equal to about 3K, or is less than or equal to its critical temperature ($T_c$) and greater than or equal to about 5K.

In one aspect of the disclosure, a MET has a frequency response about equal to the recombination of Cooper pairs for the superconducting bridge material being utilized. In another aspect of the disclosure a MET has a frequency response between about 0.7 THz and about 1.25 THz. In another aspect of the disclosure a logic gate includes one or more MET transistors. In yet another aspect of the disclosure, a first disclosed transistor is configured to emit a photon and a second disclosed transistor is configured to vary its conductivity based on the emitted photon.

BRIEF DESCRIPTION OF THE DRAWINGS

FIGS. 11A-C are schematics of MET configurations, in accordance with embodiments described herein.

DETAILED DESCRIPTION OF THE INVENTION

Figure 1:
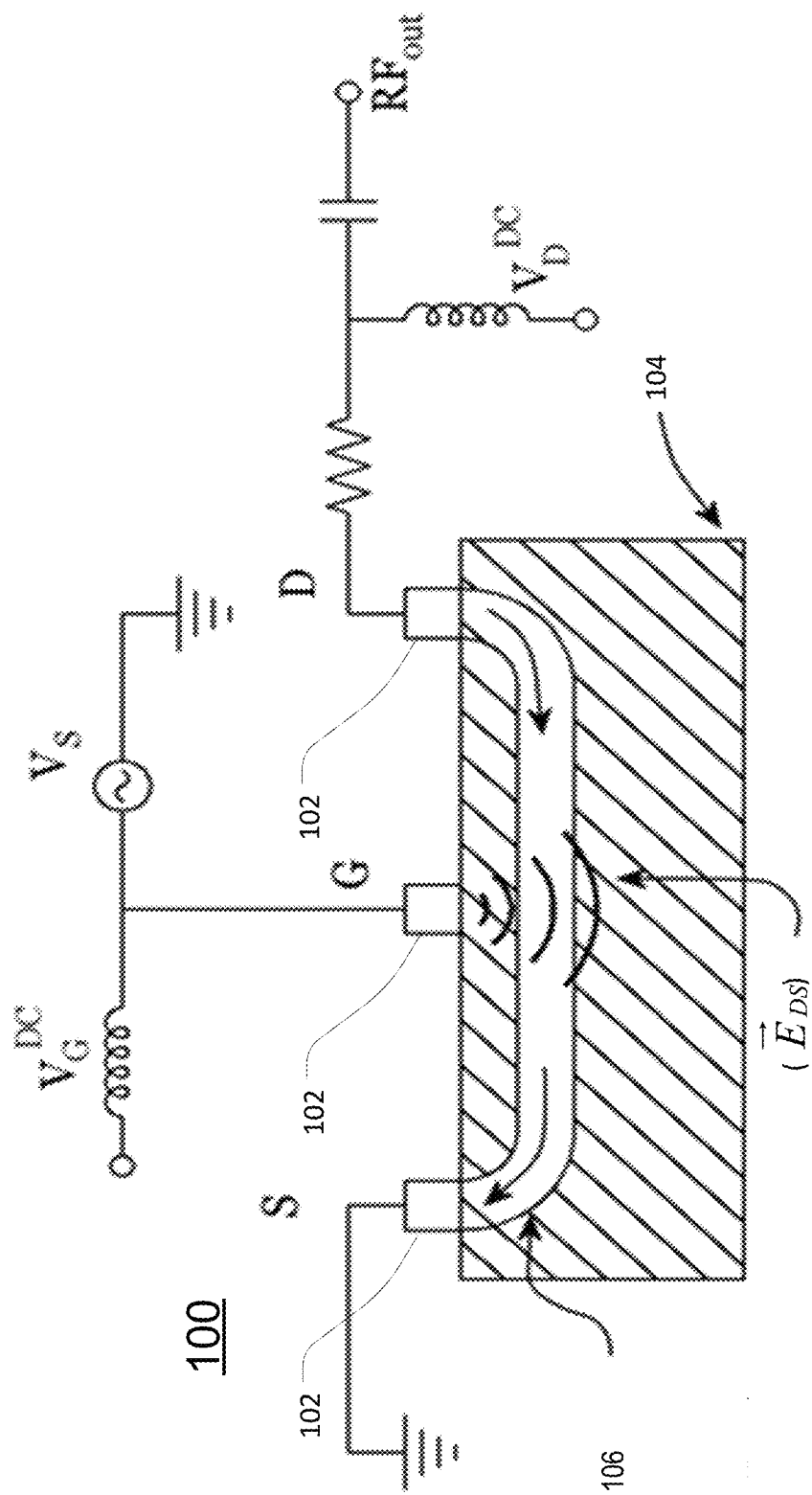
FIG. 1 is a schematic of the operating principle of a FET.

A standard Field Effect Transistor (FET) 100 has 3 ports formed by metallic electrodes 102 deposited on a semiconductor substrate 104 (see FIG. 1). These ports 3 are the gate (G), source (S), and drain (D). During fabrication impurities are added to the substrate 104 to create a p or n-type conducting channel 106 between S and D. The application of a DC voltage across S and D, $V_{DS}$, establishes an electric field $\vec{E}_{DS}$ and allows current to flow between the two ports D and S. A time varying electric field applied to G modulates the conductivity in the underlying channel exponentially; i.e. small changes in the time varying gate voltage can cause large variations in the channel conductivity σ. Since the current density $\vec{J}$ in the channel depends directly on the product of the channel's conductivity and the relatively large value of $\vec{E}_{DS}$ set by $V_{DS}$, the time varying input signal on G appears as an amplified signal on S. The optimum operating point for the FET is obtained by applying the appropriate DC voltages to each port.

Figure 2:
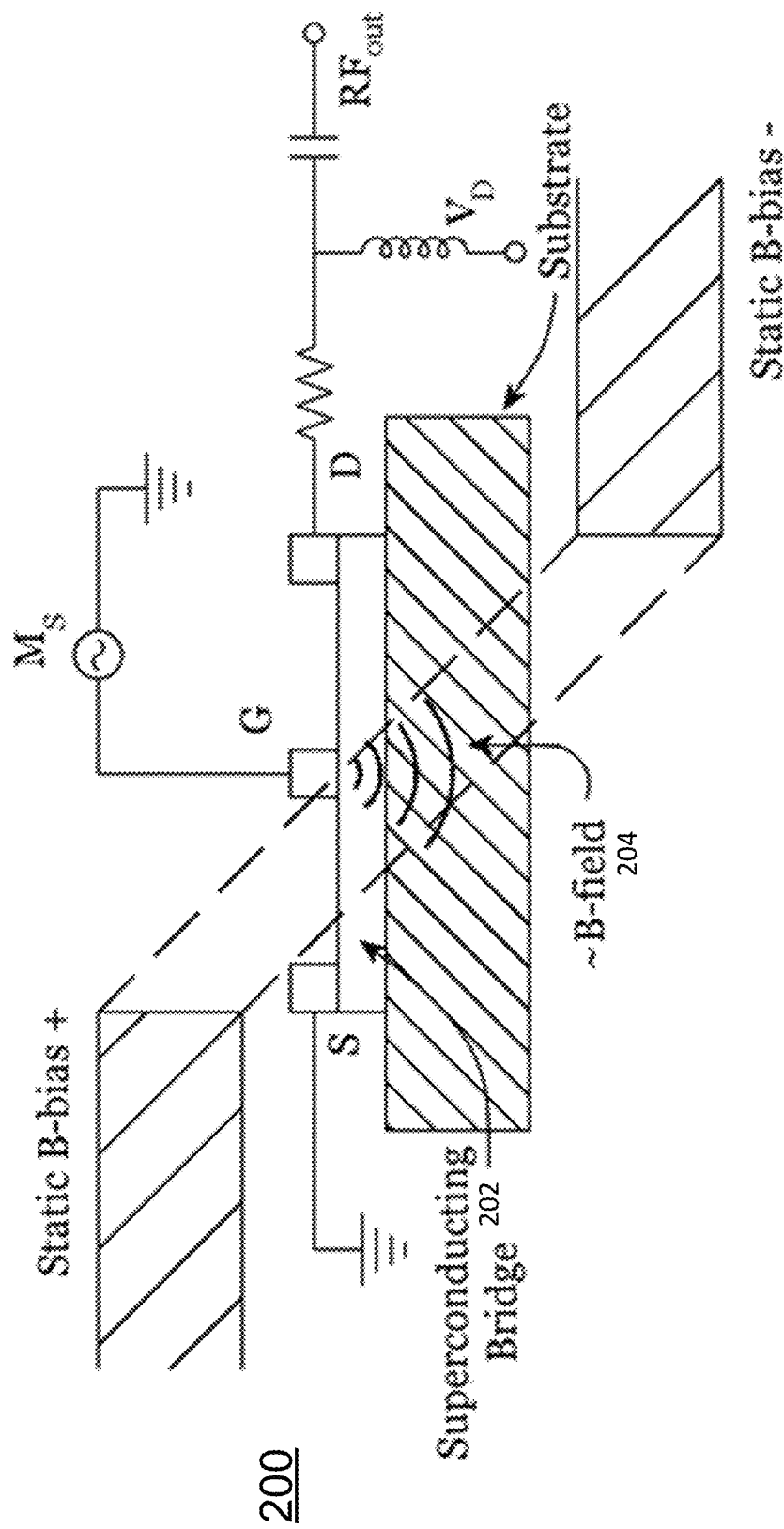
FIG. 2 is a schematic of an example MET, in accordance with embodiments described herein.

Disclosed embodiments, discussed herein collectively as various Meissner Effect Transistors (MET), are analogous only in concept to an FET, but differ in both theory of operation and construction. In one example disclosed MET 200, with reference to FIG. 2, the "channel" is a thin superconducting bridge 202 and the gate electrode G is replaced by an oscillating magnetic field 204 that modulates the bridge's (202) conductivity also in a nonlinear manner. The greatest gain (or sensitivity) occurs when the bridge 202 is magnetically or thermally biased near the point of going normal. The Operating principle of an example MET: A time varying magnetic field 204 applied at the gate electrode G modulates the conductivity of the superconducting bridge 202.

MET Superconductor Theory of Operation

Superconductors are made by forming Cooper pairs between electrons. The electrons in a Cooper pair have opposite (antiparallel) spins. Magnetic fields work to align the electron spins. Therefore, as a material makes the transition from a normal to superconducting state, it excludes magnetic fields from its interior—the Meissner effect. Similar to the skin depth effect of an electric field on the surface of a conductor, the strength of the magnetic field decays exponentially as it enters the superconductor. The London equation relates the curl of the current density $\vec{J}$ to the magnetic field:

$$\nabla \times \vec{J} = -\frac{1}{\mu_0 \lambda_L^2} \vec{B} \qquad (1)$$

$$\text{where } \lambda_L = \left(\frac{\varepsilon_0 mc^2}{ne^2}\right)^{1/2} \qquad (2)$$

$\lambda_L$ is the London penetration depth, the distance required for the incident magnetic field to decay by 1/e. n is the superconducting electron density, $\varepsilon_0$ is the material permittivity, m is the atomic mass, e is the charge of an electron.

The coherence length $\xi_0$ of a superconductor is the binding distance between Copper pairs and (to first order) marks the thickness over which the transition between a superconducting and nonsuperconducting state can be made. $\xi_0$ is inversely related to the superconducting bandgap energy $E_g$ and critical temperature $T_c$ of the material. The higher the $T_c$, the more tightly bound are the electrons in a Cooper pair.

In a Type I (where $\xi_0 > \lambda$) superconductor magnetic fields applied parallel to the surface are excluded completely up to a critical field value of $H_c$. Above this value the field has sufficient strength to parallelize electron spin vectors, thereby breaking Cooper pairs and driving the material out of the superconducting state. Fields applied perpendicular to a Type I superconductor can have effective internal values, $H_{c1}$, far higher than the applied field. The extent of the field enhancement is a strong function of the shape of the superconductor, with values ranging from 1.5 for a sphere to orders of magnitude for a thin plate with a magnetic field normal to the surface. For fields between $H_{c1}$ and $H_c$ the superconductor is in an "intermediate state," with alternating superconducting (S) and normal (N) domains. Magnetic fields pass through the N domains and are excluded (by the Meissner effect) from the S domains. As the applied field approaches $H_c$, a higher percentage of the material is in the N domain, until above $H_c$ no material is left in the S domain. See additional discussion, for example at page 101 in Kadin, A., 1999, *Introduction to Superconducting Circuits*, pub. John Wiley & Sons (New York) ("Kadin"), which is incorporated by reference herein in its entirety.

The value of $H_c$ is a function of temperature.

$$H_c = H_c(0)\left[1 - \left(\frac{T}{T_c}\right)^2\right] \qquad (3a)$$

Type I superconductors have only one $H_c$. Type II superconductors (where $\xi_0 < \lambda$) have two critical field values: $H_{c1}$, at the onset of a "mixed state" of superconductivity, and $H_{c2}$, where the B-field is strong enough to destroy all superconductivity.

$$H_{c1} = \left(\frac{H_c}{\sqrt{2}\kappa}\right)\ln(\kappa) \qquad (3b)$$

$$H_{c2} = \sqrt{2}\kappa H_c \qquad (3c)$$

where $\kappa = \lambda_L / \xi_0$.

The mixed state of superconductivity is different than the intermediate state described above. In a Type II superconductor the surface energy is negative and favors breaking up of the S and N domains into microscopic dimensions. The magnetic field penetrates the superconductor in the form of magnetized vortices and the N domains take the form of tubes of radius $\xi_0$. Each vortex contains one flux quantum $\phi_0 = h/2e = 2.07 \times 10^{-15}$ Wb. On a macroscopic scale the magnetic field appears to penetrate the entire superconductor (Kadin 1999). However, for applied field values below $H_{c1}$, Type II material behaves much like Type I material and the magnetic field is excluded through the Meissner effect.

Modulating the Conductivity of a MET Superconducting Bridge

The formation of Cooper pairs causes the superconducting material to become more ordered, thereby causing its entropy to decrease rapidly as the temperature drops below $T_c$. The reduction in entropy is reflected in the drop of free energy density $F_S$ in the superconductor as it continues to cool. As discussed above, Cooper pairs can be broken by the application of a magnetic field. The greater the value of the applied magnetic field, $B_a$, the more Cooper pairs are broken and the more $F_S$ is restored. As the value of $B_a$ increases to the critical value $B_c$ for the superconductor, the electrical conductivity, $\sigma_e$, of the material decreases and $F_S$ becomes $F_N$, the normal free energy density of the material.

$$\sigma_e \propto (1/F_S)^n, \text{ for } B_a < B_c \qquad (4)$$

In a thin film superconducting bridge of thickness $\delta$ (FIGS. 3-4) at T=0 K with $\delta \ll \lambda_L$ (Kittel 2005), $$F_S(x, B_a) = U_S(0) + (\delta^2 - 4x^2)B_a^2/64\pi\lambda_L^2 \quad (5)$$

See additional discussion, for example, at p. 295 of Kittel, C., 2005, Introduction to Solid State Physics, pub. John Wiley & Son (USA) ("Kittel"), which is incorporated by reference herein in its entirety.

Figure 3:
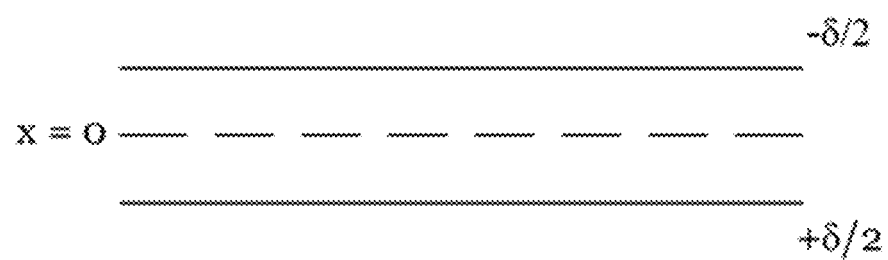
FIG. 3 is a schematic of a bridge coordinate system, in accordance with embodiments described herein.

With reference to FIG. 3, in disclosed embodiments, the x axis is perpendicular to the film plane, x=0 is at the center of the film, $B_a$ is parallel to the film, and $U_S$ (0) is the film internal energy at zero temperature and field.

The magnetic contribution to $F_s$ when averaged over the film thickness is $$F_S = \frac{1}{96\pi} B_a^2 (\delta/\lambda_L)^2 \quad (6)$$

substitution into Eq. (4) yields $$\sigma_e = \left( \frac{96\pi\lambda_L^2}{\delta^2} \left( \frac{1}{B_a^2} \right) \right)^n \quad (7)$$

In the thin superconducting bridge the value of $B_c$ is scaled by the factor $(\lambda_L/\delta)$.

$$B_c^B = \frac{\lambda_L}{\delta} B_c \quad (8)$$

When $B_a \approx B_c^B$ the superconducting bridge goes normal and behaves as a resistor. In terms of FET operation this would be analogous to the "pinch-off" condition. Under this condition, $\sigma_e \rightarrow \sigma_N$ and the expression for the bridge conductivity is $$\sigma_N = \left( \frac{96\pi\lambda_L^2}{\delta^2} \left( \frac{1}{B_c^2(\lambda_L/\delta)^2} \right) \right)^n \quad (9)$$

Taking the ratio of (6) to (8) and solving for $\sigma_e$ we find $$\sigma_e = \sigma_N \left( \left| \left( \frac{\lambda_L}{\delta} \right)^2 \left( \frac{B_c}{B_a} \right)^2 \right| \right)^n \quad (10a)$$

Since in MKS units $B = \mu_0 H$, the above expression can also be written in terms of the magnetic field intensity (H). Assuming the relationship between $\sigma_e$ and FS is linear (n=1) in the vicinity of $H_c$, Eq. (10a) reduces to $$\sigma_e = \sigma_N \left| \left( \frac{\lambda_L}{\delta} \right)^2 \left( \frac{H_c}{H_a} \right)^2 \right| \quad (10b)$$

The above expression describes the conductivity in a Type I superconducting bridge with $H_a < H_c$. By substituting $H_{c1}$ for $H_c$, the above expression can also be used for a Type II superconducting bridge.

Electrical conductivity can have both a real, $\sigma_1$, and imaginary, $\sigma_2$, component; $\sigma_e = \sigma_1 + j\sigma_2$. As a function of temperature, T, the imaginary component varies as $$\sigma_2 \propto \left( 1 - \frac{T}{T_c} \right), \text{ for } T < T_c \quad (11a)$$

$$\sigma_2 = 0, \text{ for } T \geq T_c \quad (11b)$$

See, for additional discussion, Ohashi, T., Kitano, H., Maeda, A., Akaike, H., and Fujimaki, A., 2006, "Dynamic fluctuations in the superconductivity of NbN films from microwave conductivity measurements", Phys. Rev. B, vol 73, 174522, which is incorporated by reference herein in its entirety.

For example embodiments disclosed here, the bridge is electrically, thermally, and/or magnetically biased close to the transition region of the superconductor, therefore we assume $\sigma_2$ is negligible.

Example MET Current-Voltage Characteristics

The current density through the bridge $J^B$ is equal to the product of its conductivity $\sigma_e$ and the value of the electric field $E^B$ across it.

$$J^B = \sigma_e E^B \quad (12)$$

Figure 4:
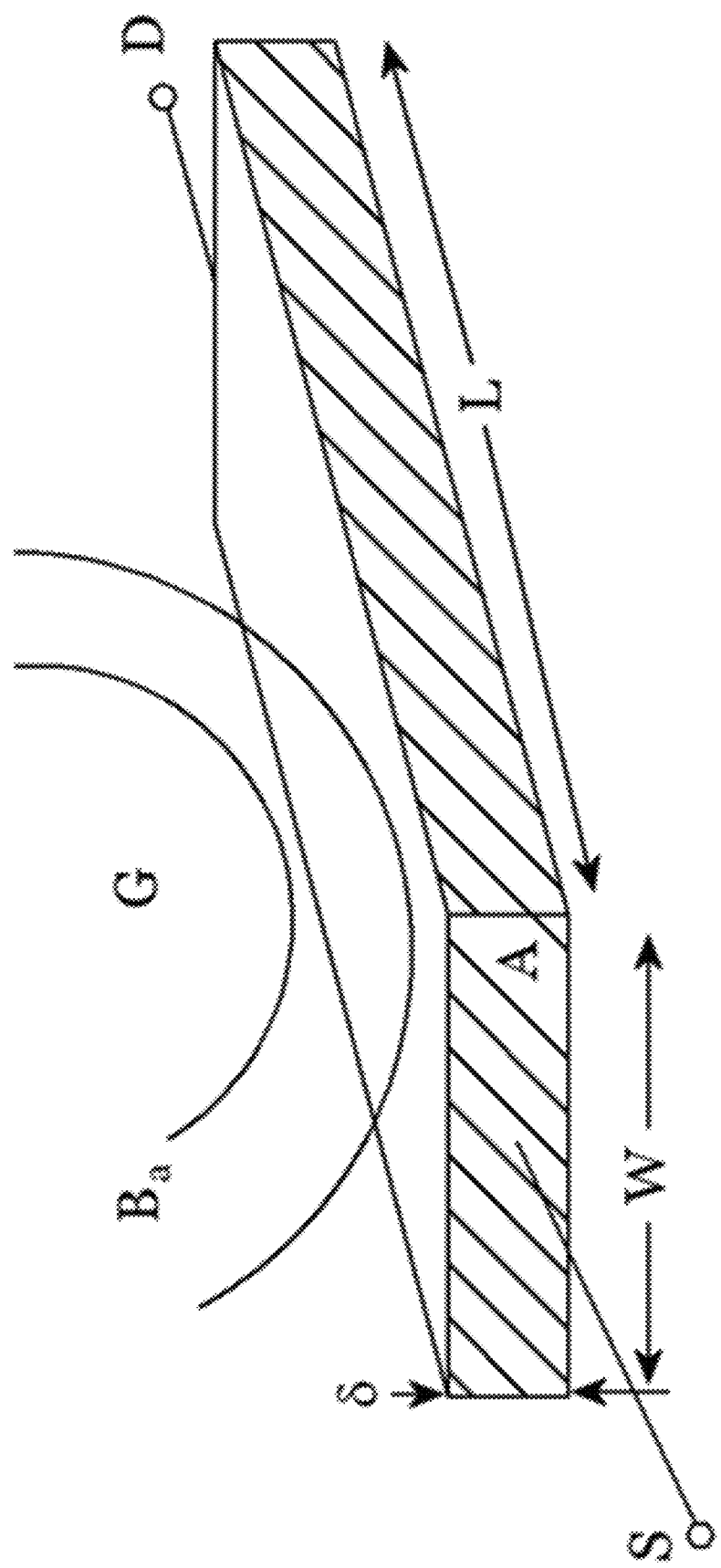
FIG. 4 is a schematic of an example portion of a MET, in accordance with embodiments described herein and describes an example MET geometry: A time varying magnetic field ($H_a$) applied at location G modulates the conductivity of a superconducting bridge with width W, length L, and thickness δ; D and S refer to the drain and source connections.

Assuming the geometry shown in FIG. 4, the drain-source current $I_{DS}$ in the bridge is given by $$I_{DS} = J^B A = \sigma_e E^B A = \sigma_e A \left( \frac{V_{DS}}{L} \right), \text{ where, } A = \delta W. \quad (13)$$

Substituting (10b) into (13) yields the following expression for $I_{DS}$.

$$I_{DS} = \sigma_N \frac{\lambda_L^2 W}{\delta L} \left[ \frac{H_c}{H_a} \right]^2 V_{DS}, \text{ where, } H_c > H_a > 0. \quad (14)$$

In the large field limit ($H_a > H_e$), $\sigma_e \rightarrow \sigma_N$ and (12) reduces to Ohm's Law, $$I_{DS} = \sigma_N \left( \frac{A}{L} \right) V_{DS} = \rho^{-1} \left( \frac{A}{L} \right) V_{DS} = \frac{V_{DS}}{R} \quad (15)$$

where, $\rho$ is the bridge resistivity ($\Omega$-m) and R is the bridge resistance ($\Omega$).

Equation (14) shows that the relationship between $I_{DS}$ and $H_a$ is parabolic, analogous to the relationship between $I_{DS}$ and the gate voltage $V_G$ in a conventional FET. This similarity suggests the gain characteristics of an MET will also be analogous to those of a FET.

MET DC Small Signal Model

Because of the applications discussed above, a linear small signal model for an MET is derived using the same approach as is used for a FET, but with improved MET features. For the approach used for a FET, see for example at page 318, Millman, J. and Halkias, C., 1972, *Integrated Electronics: Analog and Digital Circuits and Systems*, pub. McGraw-Hill (New York), which is incorporated by reference herein in its entirety.

With respect to disclosed METs, from (13) we find that the small signal drain current, $i_D$, is a function of both the small signal drain voltage, $v_{DS}$, and the magnetic field applied to the bridge, $H_a$.

$$i_D = f(H_a, v_{DS}) \quad (16)$$

The magnetic drain resistance can be defined as $$r_d = \left.\frac{\partial v_{ds}}{\partial i_D}\right|_{h_a} = \frac{1}{\sigma_N} \frac{\delta L}{W \lambda_L^2} \left(\frac{H_a}{H_c}\right)^2 \quad (17)$$

with units of $\Omega$.

The small signal drain current can then be expressed as $$i_D = \frac{A}{L} h_a + \frac{v_{ds}}{r_d} \quad (18)$$

Analogous to a FET, a magnetic amplification factor for the MET can be defined as $$\mu_m = \left.\frac{L}{A} \frac{\partial i_D}{\partial H_a}\right|_{v_D} = 1 + \sigma_N \frac{\lambda_L^2}{\delta L} \frac{H_c^2}{H_a^3} V_D \quad (19)$$

Figure 5:
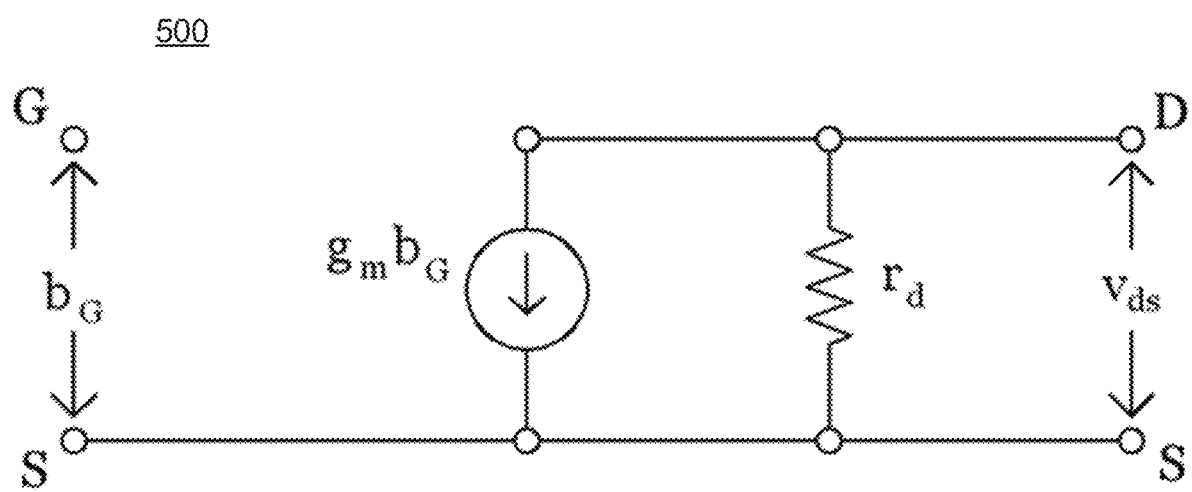
FIG. 5 is a schematic of an equivalent circuit, in accordance with embodiments described herein.

A non-limiting example MET equivalent circuit 500 with the features of (18) is shown, for example, in FIG. 5.

In a simple example implementation of an example MET discussed here, the input signal, $H_{sig}$, is applied directly to the superconducting bridge from the waveguide or control line; there is no gate electrode. Therefore, there is no gate source or drain capacitance to limit the high frequency response. The MET works by modulating the conductivity of the superconducting bridge through applying time varying and static magnetic fields. The superconducting bridge has been biased under a magnetic field separate from the input signal under an applied magnetic field $H_a$ Together these applied fields destroy Cooper pairs decreasing the conductivity of the bridge. The response time of the MET is therefore set by the relaxation time $\tau_0$ of the Cooper pairs, i.e. the time it takes for them to recombine. To first order $\tau_0$ can be estimated from the uncertainty principle, $$\Delta t \gtrsim \hbar / \Delta E \quad (20)$$

where $\Delta t$ is identified with $\tau_0$ and $\Delta E$ with $kT_c$, the thermal energy of the superconductor at its critical temperature. For additional discussion see, for example, Ramallo, M. V., Carballiera, C., Vina, J Veira, J. A., Mishonov, T., Pavuna, D., and Vidal, F., 1999, *"Relaxation time in Cooper pairs near $T_c$ in cuprate superconductors"*, Europhys. Lett, 48 (1), p. 79, which is incorporated by reference herein in its entirety.

$$\tau_0 \sim \frac{\hbar}{kT_c}. \quad (21)$$

In one non-limiting example embodiment, the superconductor bridge includes niobium. The bridge material may include any material configured to operate in the Meissner effect regime. That is, in one example embodiment a type I superconductor material at or below its respective critical temperature $T_c$ and in the presence of an applied magnetic field $H_a$ at or below its respective $H_c$ or a type II superconductor at or below its respective critical temperature $T_c$ and in the presence of an applied magnetic field $H_a$ at or below its respective $H_{c1}$. For example, niobium (Nb) is a suitable type II superconductor and, for the purposes of the following discussion niobium, will be used. However, it should be understood that other superconductors may also be used. For example, a non-exhaustive list of bridge materials may include lead, tantalum, and alloys thereof including niobium titanium and niobium nitride alloys, as well as high temperature superconductors, such as bismuth strontium calcium copper oxide (BSCCO) and yttrium barium copper oxide (YBCO).

Substituting into the above expression (21) for niobium ($T_c$=9.5K) gives a value of $\tau_0$=8×10$^{-13}$ sec, yielding an upper frequency limit for the corresponding operating MET $$v_{max} \leq 1/\tau_0 \leq 1.25 \text{ THz.} \quad (22)$$

$v_{max}$ is closely related to the gap frequency of the superconductor $v_g$ Above $v_g$ incident photons have sufficient energy to break Cooper pairs and drive the superconductor normal.

A superconductor with energy gap $E_g$ has a gap frequency $v_g$, $$v_g = E_g/h \quad (23)$$

where, $E_g \approx 7/2 \, kT_c$.

(for additional discussion see, for example, Karecki, D., Pena, R., and Perkowitz, S., 1982, "Far-infrared transmission of superconducting homogeneous NbN films: Scattering time effects", *Phys. Rev. B.*, vol. 25, no. 3, p. 1565), which is herein incorporated by reference in its entirety).

For niobium, substitution into Eq. (23) gives a value of $v_g \simeq 0.7$ THz, consistent with the estimated value for $v_{max}$. Since $v_g \leq v_{max}$, in certain MET embodiments, we will adopt $v_g$ as the maximum operating frequency for a MET.

Example Parameters

In one example embodiment, we want the magnetic field of the input signal to have the maximum effect on the conductivity of the bridge. The strength of the field drops with distance from the input probe, so $\lambda_L$ should be small, but not so small that only an exceptionally thin layer of the bridge is affected. A compromise is to use a superconducting material where $\lambda_L \approx \delta$. we want the magnetic field of the input signal to have the maximum effect on the conductivity of the bridge. As an example, if we assume the bridge is made of Nb. Typical parameters for Nb bridges used in a hot-electron bolometer ("HEB") work are:

Normal State Conductivity=$\sigma_N$=6.93×10$^6$ ($\Omega$-m)$^{-1}$
Critical Field Density at 0 K=$B_c(0)$=0.198 T
London Penetration Depth=$\lambda_L$=100 nm
Coherence Length=$\xi_0$=40 nm
Bridge Thickness=$\delta$=100 nm
Bridge Width=W=1×10$^{-4}$ cm
Bridge Length=L=2×10$^{-4}$ cm
Critical Temperature with no magnetic field=$T_c$=9.5 K
Physical temperature=T=6.5K
Permeability of Free Space=$\mu_0$=4$\pi$×10$^{-7}$ H/m
Permittivity of Free Space=$\varepsilon_0$=8.85×10$^{-12}$ F/m Niobium is an example of an elemental superconductor that is Type II (where $\xi < \lambda_L$). Since it is Type II, $H_c$ should be replaced by $H_{c1}$ in the above equations. Before substitution, all parameters should be converted into MKS units. Substitution of the parameters for Nb into (12) allows a graphical representation (see FIG. 6) of the common source drain characteristics, $$I_D\left(V_D, \frac{H_c}{H_a}\right),$$

of example s operating in various conditions.

Figure 6:
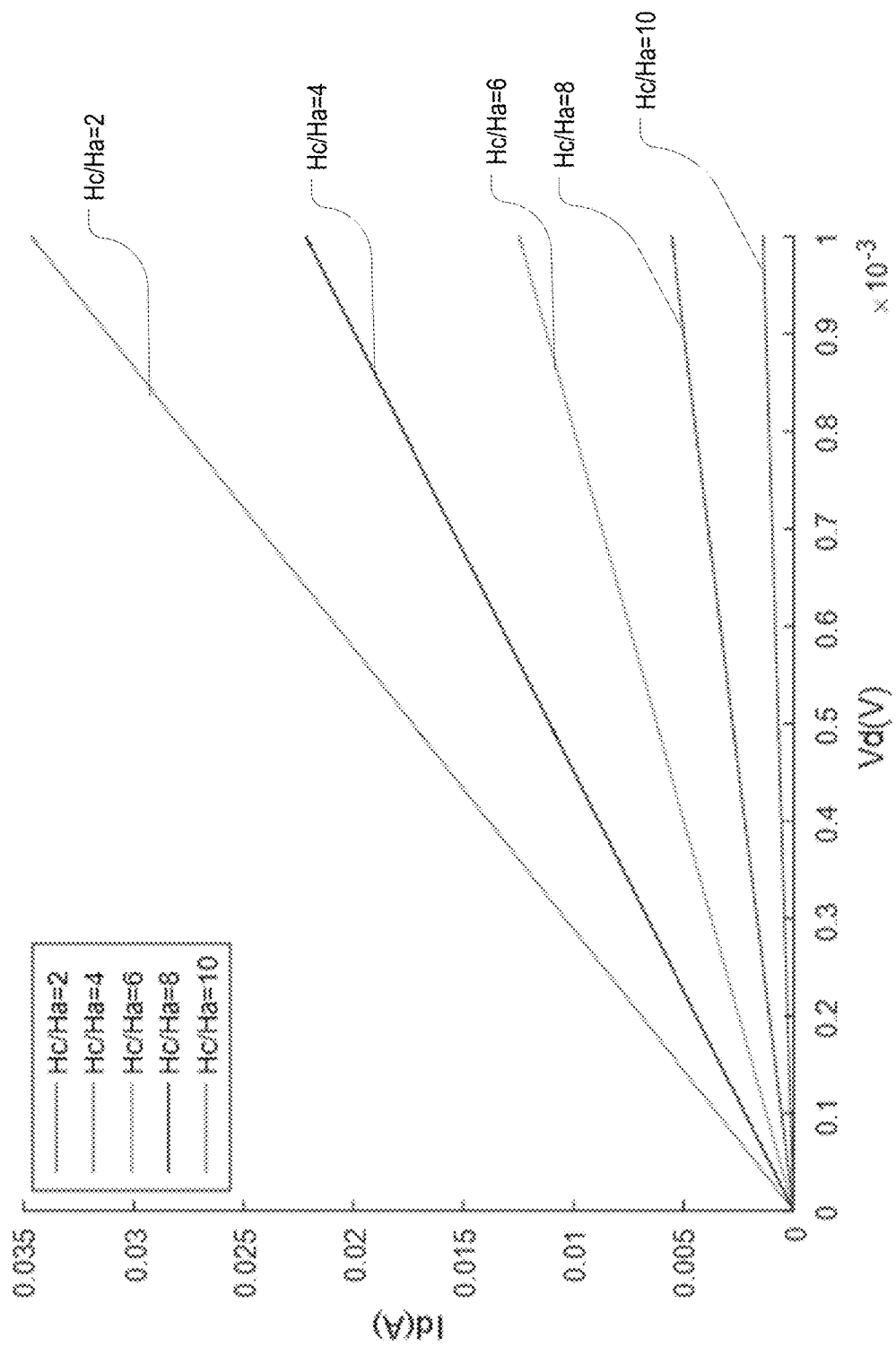
FIG. 6 is a graph of example source drain characteristics, in accordance with embodiments described herein.

As a comparison, the drain characteristics of a FET have an "ohmic region" where $I_D$ is proportional to $V_D$ and a "constant current region" where $I_D$ rolls off due to an ohmic voltage drop across the channel. This voltage drop causes the channel to "pinch-off" when $V_D$ gets sufficiently high. In FIG. 6 we can see that an MET also has an ohmic region where $I_D$ is proportional to $V_D$. The bridge of an MET does not experience a pinch-off as does the doped channel of a FET. However, at sufficiently high values of $V_D$ (or for $H_a \geq H_c$) the bridge will go normal, causing the family of curves in FIG. 6 to all break to a common slope. The value of $V_D$ at which the break will occur depends on the geometry of the bridge (13), the temperature of the bridge (15), and the magnitude of the magnetic bias $H_a$. The drain resistance, $r_d$ is found to be <3·Ω for values of $H_a/H_c$<1, see for example FIG. 7.

Figure 8:
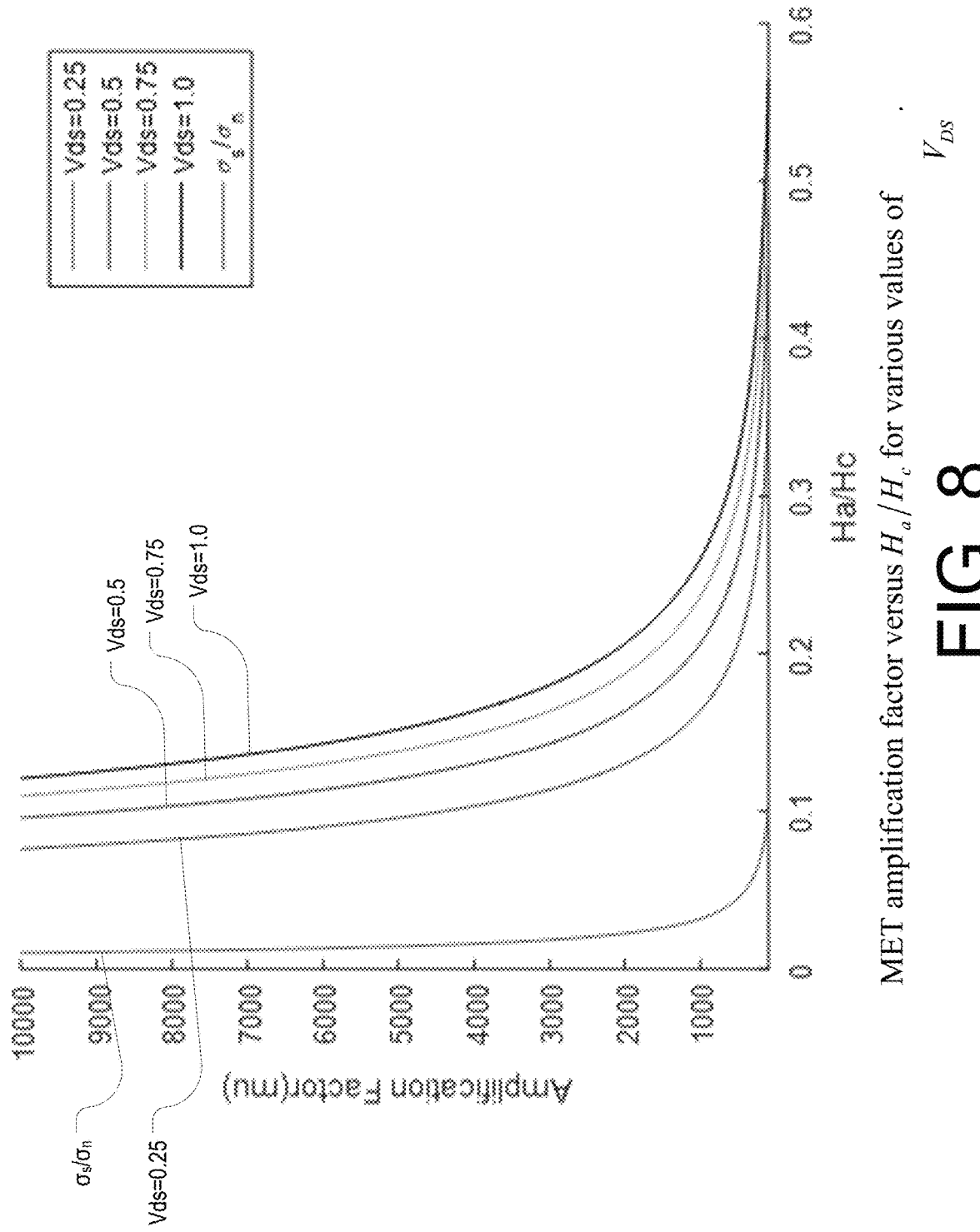
FIG. 8 is a graph of example MET amplification factor versus $H_a/H_c$ for various values of $V_{ds}$, in accordance with embodiments described herein.

Example METs are capable of providing a high amplification factor $\mu_m$. Substituting the device parameters listed above into (19) yields values of $\mu_m > 10^9$ for $V_{DS} = 0.25$ mV and $H_a/H_c < 1$. The ratio of conductivity of the bridge in superconducting state to normal state $$\left(\frac{\sigma_s}{\sigma_n}\right)$$

sets the lower limit for amplification factor for a given value of $H_a/H_c$ in the absence of $V_{DS}$. (See FIG. 8)

Additional MET Operations

Figure 13:
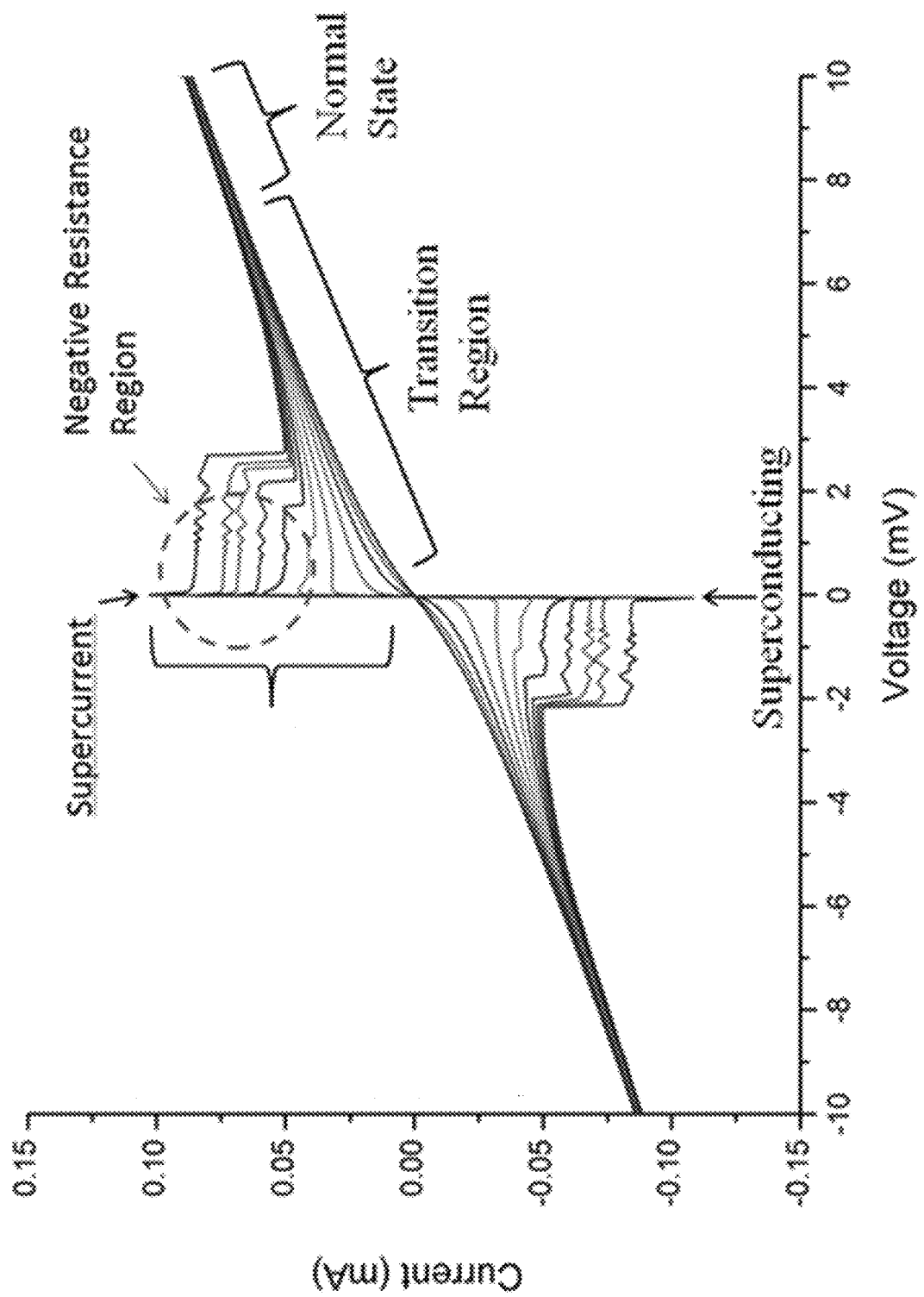
FIG. 13 is a graph of current vs. voltage and showing a negative resistance region, in accordance with embodiments described herein.

In example METs an increase in applied magnetic field $H_a$ causes the conductivity and the current flowing through the superconducting bridge to decrease (see FIG. 13). By increasing applied magnetic field and applying a DV voltage, the MET bridge can be biased into a negative resistance regime, from which it can operate as an amplifier or oscillator. METs can exhibit a "magnetic" negative resistance. This behavior is apparent from FIG. 6, where higher values of $H_c/H_a$ result in higher current levels and from FIG. 8 where lower values of $H_a/H_c$ yield higher amplification factors. As with other negative resistance devices, the MET can be configured into any number of devices, non-limiting examples include an amplifiers, oscillators, or any number of logic gates for which known transistors may be used (see FIGS. 14 and 15).

Example MET Amplifier

Figure 9A:
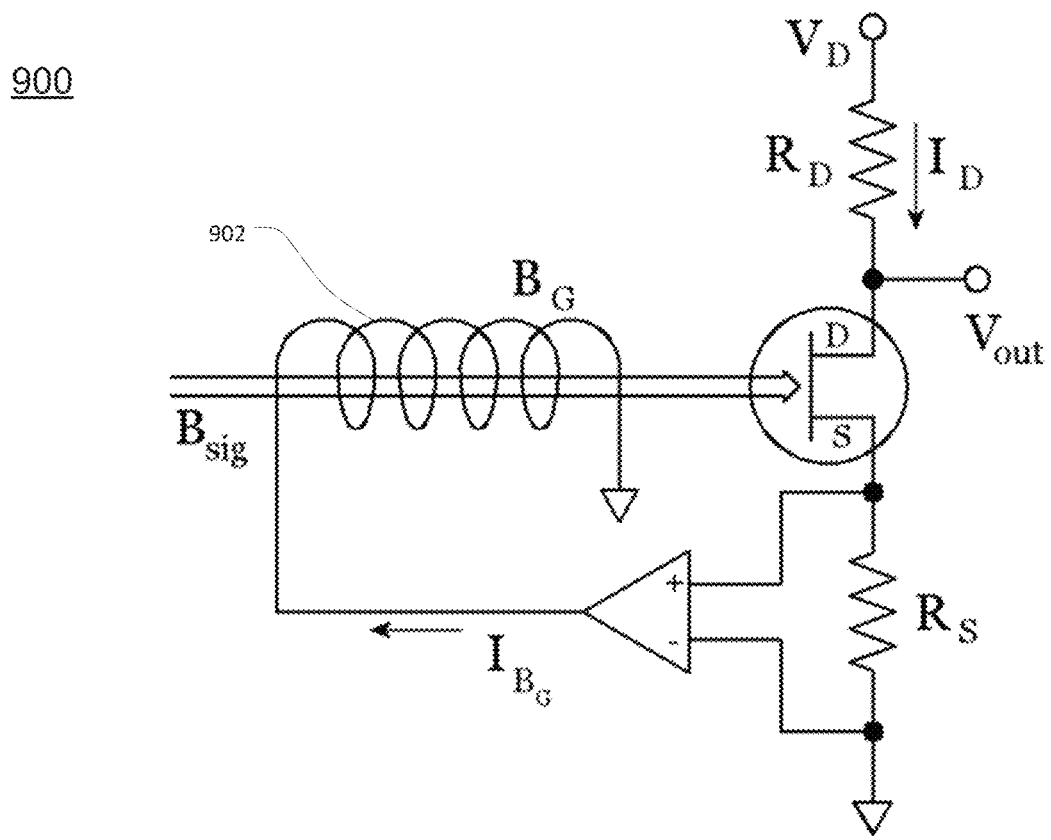
FIGS. 9A-9B include a schematic and an example implementation of MET amplifier circuit, in accordance with embodiments described herein.
Figure 9B:
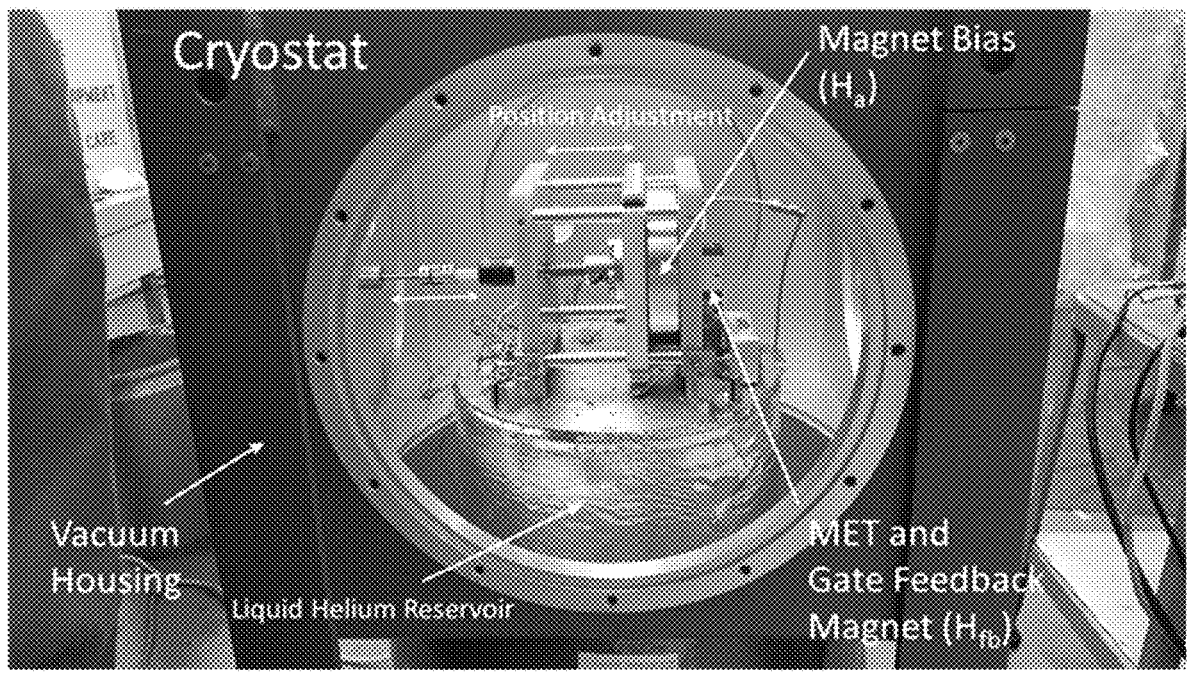

An example schematic representation and an example embodiment of a MET amplifier circuit 900 with stabilizing magnetic feedback is shown in FIGS. 9A and 9B, respectively. However, other configurations known to a skilled person may also be used. As $I_D$ increases, the voltage drop across $R_s$ increases as does the drive current on the solenoid 902 providing the negative feedback gate magnetic bias, $H_{fb}$. Larger values of $H_{fb}$ reduce the gain of the amplifier (see FIGS. 9A and 9B) and thereby reduces $I_D$. Similarly, a drop in $I_D$ reduces $H_{fb}$, increasing gain and thereby increasing $I_D$ to the desired value. $H_{sig}$ (also notated as $B_{sig}$) is the time varying, input signal to be amplified.

Figure 10:
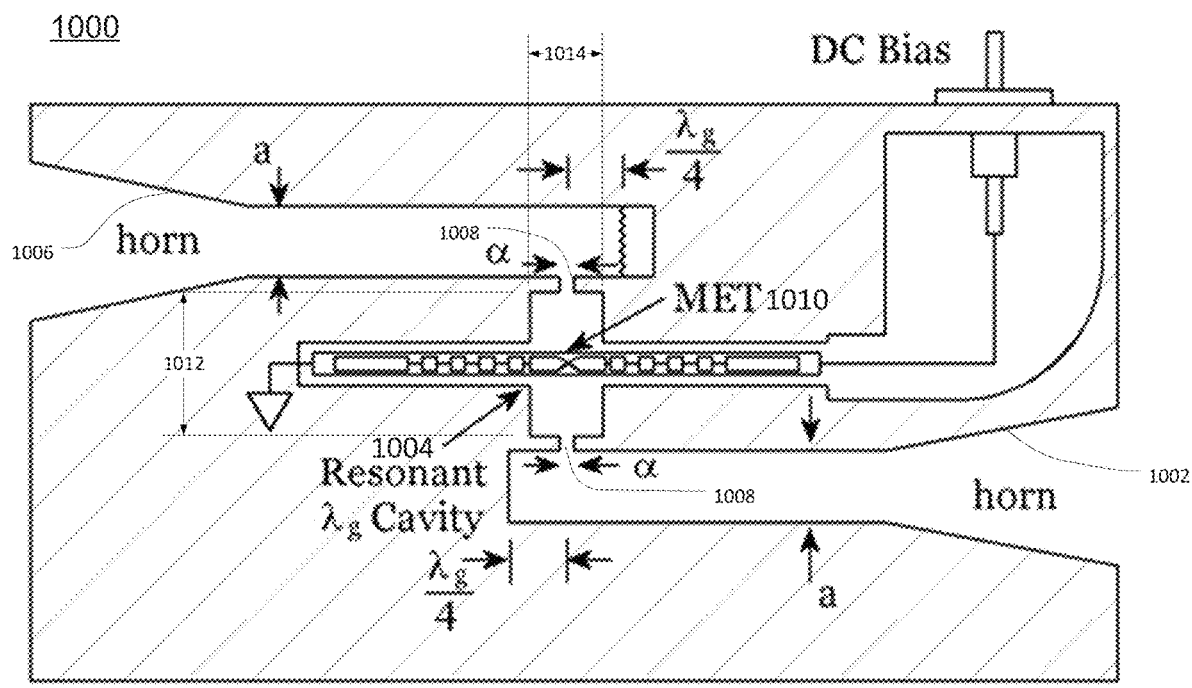
FIG. 10 is a schematic of an equivalent MET amplifier implemented in a waveguide mount circuit, in accordance with embodiments described herein.

An example configuration for using an MET as an amplifier 1000 is shown in one example configuration in FIG. 10. This example shows the input signal coming in via a control line formed from a waveguide (shown as a horn 1002) coupled to the resonant cavity 1004). Thus, the MET is immersed in the signal waveguide. Other control lines may also be used that produce the emitted magnetic field. For example, the control line may include any radiating structure, for example, a current loop, exposed feed line connected to ground (or, for example, the substrate), a microstrip close to the superconducting bridge, a radiating antenna (such as a planar antenna, dipole, or the like). The control line may be fed by any transmission line known in the art, for example, parallel cable, coaxial cable, or the like in accordance with frequency, current, and loss requirements. The distance of the control line to the superconducting bridge may be any effective distance for the emitted magnetic field to interact with the superconducting bridge. However, a more sensitive MET will require closer distances. The distance, in one example, will be at or greater than the coherence length of the superconductor, i.e. the binding distance of the respective Cooper pairs. The maximum distance will vary depending on the strength of the magnetic field in the control line.

In one example, as shown in FIG. 10, the input and output signals care coupled to a full height, 1λ resonant waveguide cavity 1004 via feedhorns 1002, 1006 and small (≤10 dB) coupling apertures 1008. The dimensions of the resonant cavity 1004, feedhorns 1002, 1006, and coupling apertures α (1008) may be varied and tuned with respect to the particular MET 1010 in use. In one example, the depth of the resonant cavity 1004 (the dimension of the resonant cavity normal to the FIG. 10 paper) is an integer multiple of λ/2. In one example, the height 1012 of the resonant cavity (the dimension of the resonant cavity from one aperture to the other aperture in FIG. 10) is an integer multiple of λ/2. In one example, the width 1014 of the resonant cavity (as shown in FIG. 10 and discussed further below) is an integer multiple of λ/2. With reference to FIGS. 11A-11C, the MET detail 1100 example shown in FIG. 11A includes a niobium bridge 1102 located at the apex of a "bow-tie" current probe 1104 (FIG. 11A). The superconductor bridge 1100, shown in FIG. 11(B) is oriented such that the width w (FIG. 11A) is substantially parallel to the plane of the page. However, in other example embodiments, the superconductor bridge may be oriented different, for example such that the width w (FIG. 11A) is perpendicular to the plane of the page.

As discussed above, other materials besides Niobium appropriate to a particular desired MET performance may also be used. The current probe 1104 is shown in FIGS. 11A-11C as an Au current probe. However, other highly conductive materials known in the art may also be used. The bridge 1102 and probe 1104 are fabricated on a thin (δ<<λ) dielectric substrate, for example, a substrate 1106 comprising crystalline quartz and/or silicon oxide, or any other known substrate material which is suspended across the waveguide. To either side of the probe 1104 (FIG. 11B) are a series of high-low microstrip sections 1108 which serve as an radiofrequency (RF)-choke to keep the time varying field within the cavity while providing a path for the DC bias current. In one amplifier configuration, unlike the situation with typical voltage-controlled devices, the MET should be located at the current (not voltage) maximum. The field geometry within a 1λ cavity will put a current maximum along the MET when the device is located across the cavity center. In order to magnetically bias the MET, the waveguide mount is immersed in a field, $H_a$, specified by the devices drain characteristics, see for example, FIG. 6.

Example MET Oscillator

For the MET to operate as an amplifier the value of $H_a$ will often approach $H_c$. However, there are many applications where a signal source may be required. For these applications, the negative feedback provided by the ambient magnetic field is reduced, in one example configuration, until the MET operates as a negative resistance oscillator.

For these applications the resonant cavity (e.g. 1004 of FIG. 10) is sealed at one end and only an output feedhorn 1006 is required.

As discussed above, when operated near the normal-superconducting transition, the impedance of a MET will have little, if any reactive component (see Eq. 10b). Therefore the oscillator frequency will be set largely by the physical dimensions of the waveguide cavity. The size of the cavity determines the time delay/phase per reflection and therefore the cavity resonant frequency. For a cavity of length z the round-trip time is $$t = \frac{2z}{c}.$$

The oscillator can operate at frequencies $$f = \frac{cm}{2z},$$

where m is a multiple of $$\frac{\lambda}{2}.$$

The upper frequency limit, $v_{max}$, is given by Eq. (22).

The maximum power $P_{out}$ from the oscillator is a function of the drain current, $I_D$, and the MET drain resistance, $r_d$.

$$P_{out} = I_D^2 r_d \quad (24)$$

Figure 7:
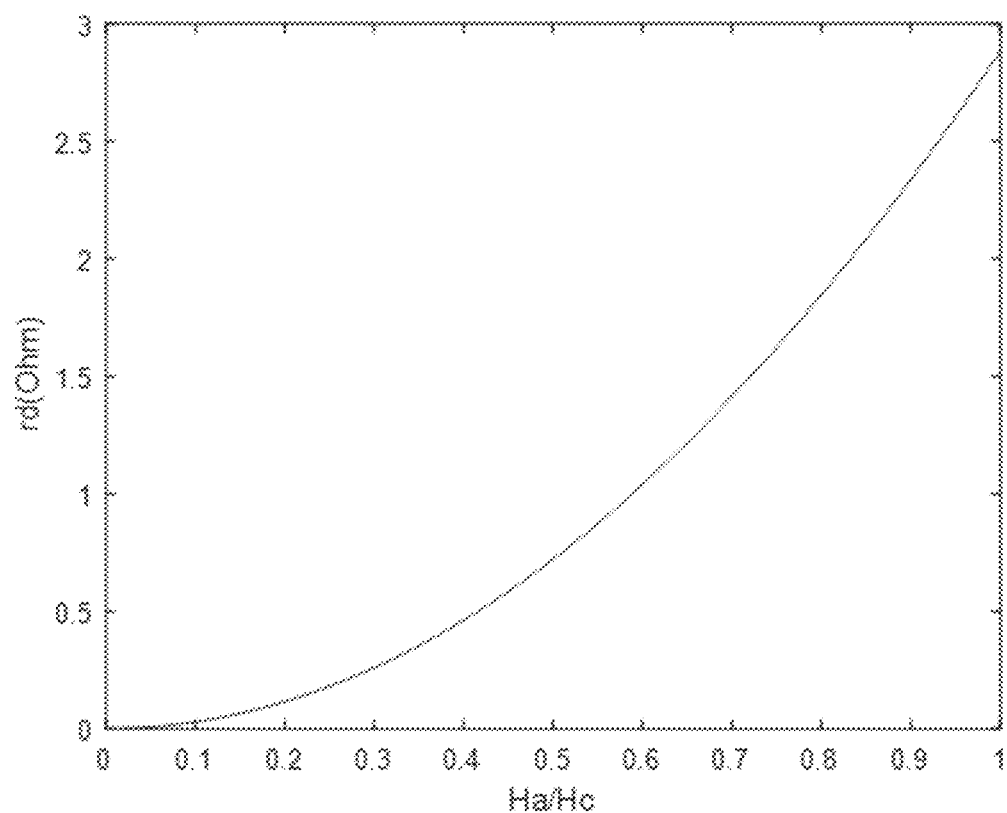
FIG. 7 is a graph of example MET magnetic drain resistance as a function of applied field, in accordance with embodiments described herein.
Figure 12:
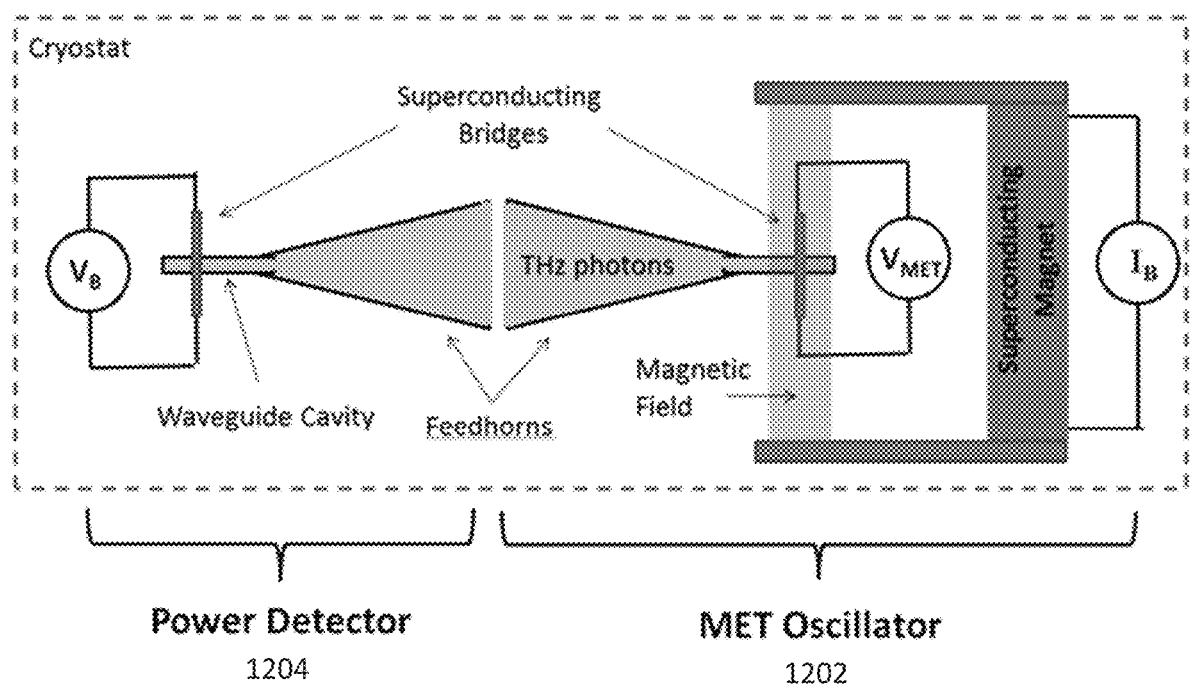
FIG. 12 is a schematic of example MET operation of a MET oscillator and/or power detector, in accordance with embodiments described herein.

For a value of $H_a/H_c=0.8$, FIG. 7 indicates a value of $r_d \approx 1.7\Omega$. Similarly, for an $H_c/H_a=1.25$ and a drain voltage, $V_D$, of 1.0 mV, FIG. 6 gives a value of $I_D \approx 2$ mA. Substitution into (24) yields a value of $P_{out} \approx 1.7$ µW. This power level is sufficient to serve as a local oscillator for superconductor-insulator-superconductor ("SIS") or HEB mixers. These mixers operate at physical temperatures comparable to that of the MET. Therefore, in one configuration an MET oscillator and/or amplifier can be integrated into an SIS or HEB mixer block. FIG. 12 illustrates the operation of one embodiment of an MET oscillator. A super conducting bridge, in one example configuration can be used as an oscillator 1202, mixer, and/or as a detector 1204.

Advantages of a MET as Compared to a Flux Flow Transistor

A superconducting flux flow transistor (SFFT) also works by modulating the conductivity of a superconducting bridge by applying a time varying magnetic field. However, the conductivity in a SFFT is controlled by injecting magnetic vortices into a Type II superconductor operating in the mixed state. Thus it does not operate in a Meissner effect regime. See, for example, Nordman, J., 1995, "Superconductive amplifying devices using fluxon dynamics", *Supercond. Sci. Technol.*, 8, p. 881, which is incorporated by reference herein in its entirety. In contrast, the conductivity in a MET is controlled by way of the Meissner effect operating on a Type I superconductor where $H_a < H_c$ or on a Type II with $H_a < H_{c1}$. For a SFFT the upper operating frequency is limited by the vortex traversal time to frequencies $\lesssim 1$ GHz (See discussion in Kadin). In contrast, the MET does not rely on vortex diffusion. As discussed above, its upper frequency limit is determined by the Cooper pair relaxation time and is of order 1 THz for commonly used superconductors (e.g. Nb). The MET is therefore better suited for high frequency applications.

We have introduced the concept of the Meissner Effect Transistor and presented its theory of operation. We have also derived performance curves for a MET that utilizes a niobium bridge typical of those used in superconducting devices. The application of the MET in both a THz amplifier and oscillator were described as just several examples of uses of a MET. Others will be apparent to a person of ordinary skill after reading this disclosure. The fast switching speed and low power dissipation of the MET make it a candidate for high speed computer applications.

Example MET Gates

Figure 14:
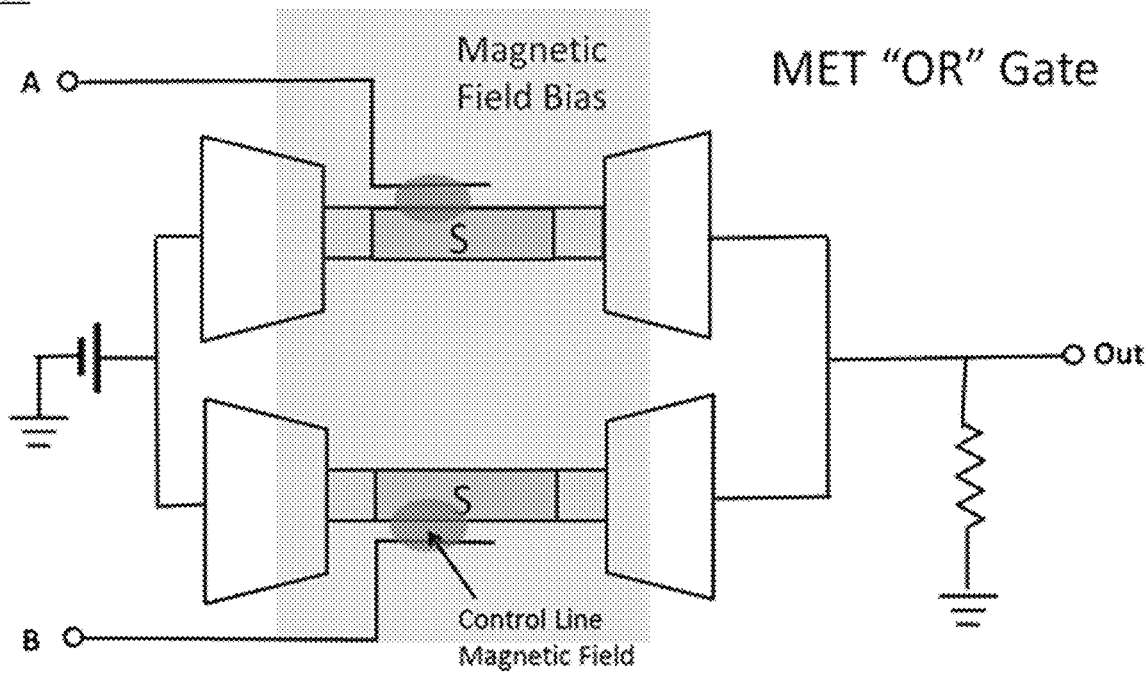
FIG. 14 is a schematic of a MET logic gate, in accordance with embodiments described herein.
Figure 15:
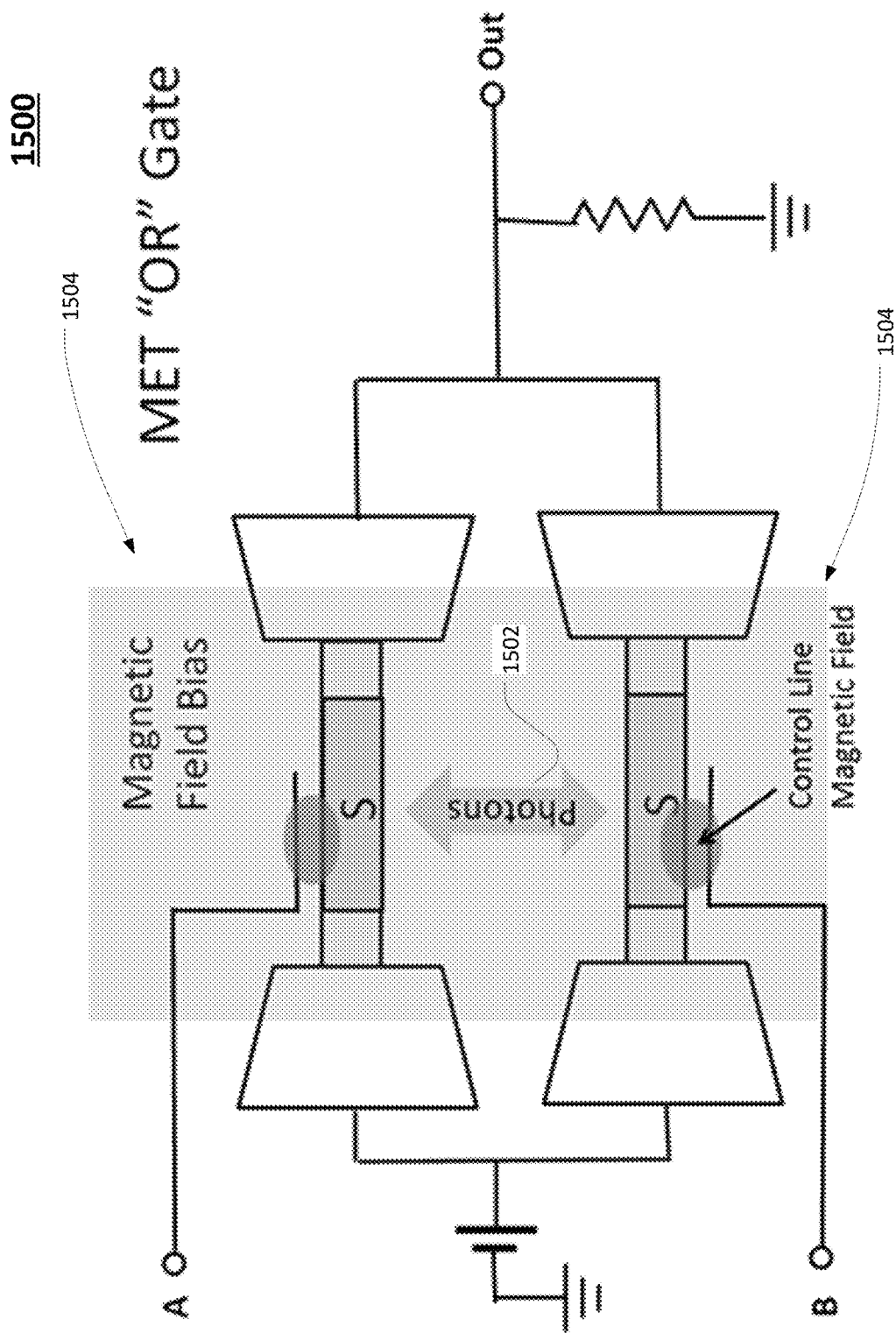
FIG. 15 is a schematic of a MET logic gate, in accordance with embodiments described herein.

With reference to FIGS. 14 and 15, MET's, as described throughout this disclosure, can be configured to create any classic logic gate known in the art. Shown in FIG. 14 is an example "OR" gate 1400. In addition to classical logic gates, METs, in one example, can be configured to as "multi-state" logic gates as shown, for example, in FIG. 15. Photons 1502 generated in METs 1504 can, in one example, entangle the "conducting states" of neighboring devices 1504 providing for multiple states.

APPENDIX I. INPUT SIGNAL POWER LEVEL

An MET amplifier is sensitive to the time variations in the magnetic field component of the signal to be amplified. The relationship between the electric and magnetic field components of an electromagnetic wave is provided by the Poynting vector. (Griffiths, D., 1999, *Introduction to Electrodynamics*, pub. Prentice Hall (New Jersey))

The energy flux density transported by the electric and magnetic fields is $$\vec{S} = \frac{1}{\mu_0}(\vec{E} \times \vec{B}). \quad \text{(A-1)}$$

The time average over many cycles is $$\langle \vec{S} \rangle = \tfrac{1}{2} c \varepsilon_0 E_G^2 \hat{z} \quad \text{(A-2)}$$

The average power per unit area (W/m$^2$) of an EM wave is called the intensity (or flux).

$$F = \tfrac{1}{2} c \varepsilon_0 E_G^2 \quad \text{(A-3)}$$

Rearranging, $$E_G = \left[\frac{2F}{c\varepsilon_0}\right]^{1/2}, B_G \left[\frac{2F}{c^3\varepsilon_0}\right]^{1/2} \quad \text{(A-4)}$$

$E_G$ and $B_G$ are the amplitudes or peak values of the fields. If rms values are used, then the factor of ½ in the Poynting vector is dropped.

Equation (A-4) then becomes $$E_G^{rms} = \left[\frac{F}{c\varepsilon_0}\right]^{1/2} \text{ and } B_G^{rms} = \left[\frac{F}{c^3\varepsilon_0}\right]^{1/2}.$$

The invention claimed is:

1. A superconducting Meissner effect transistor comprising: a superconducting bridge between a first and a second current probe, the first and second current probe being electrically connected to a source and a drain electrical connection, respectively, wherein the superconducting bridge includes a plurality of Cooper pairs having anti-parallel spins;
a magnetic field bias, wherein a strength of the magnetic field bias at the superconducting bridge ($H_a$) is less than or equal to a first critical field value for the superconducting bridge;
a control line; and
a magnetic field signal emitted from the control line, the magnetic field signal having a signal strength $H_{sig}$ at the superconducting bridge, wherein the emitted magnetic field signal breaks at least a portion of the Cooper pairs in the superconducting bridge into forced parallel spins.

2. The transistor of claim 1, wherein the magnetic field signal decreases conductivity of the superconducting bridge by breaking Cooper pairs.

3. The transistor of claim 1, wherein the first critical field value is ($H_c$) for the superconducting bridge.

4. The transistor of claim 3, wherein $H_a$ is less than or equal to the magnitude of $H_{sig}$ subtracted from $H_c$.

5. The transistor of claim 3, wherein $H_{sig}$ is a time varying magnetic field having a maximum strength of $H_{sig-max}$ and a minimum strength of $H_{sig-min}$.

6. The transistor of claim 5, herein $H_a$ is less than or equal to the magnitude of $H_{sig-max}$ subtracted from $H_c$.

7. The transistor of claim 3, wherein the superconducting bridge is a type I superconductor.

8. The transistor of claim 3, wherein the superconducting bridge is a type II superconductor and $H_c$ is $H_{c1}$ and $H_{c1}$ is a strength of the magnetic field at the superconducting bridge at an onset of a mixed state of superconductivity for the superconducting bridge.

9. The transistor of claim 1, wherein the superconducting bridge has a temperature that is less than or equal to its critical temperature ($T_c$).

10. The transistor of claim 1, wherein the superconducting bridge comprises niobium and/or niobium alloys.

11. The transistor of claim 10, wherein the superconducting bridge has a temperature that is less than or equal to its critical temperature ($T_c$) and greater than or equal to about 0.2K.

12. The transistor of claim 9, wherein the superconducting bridge has a temperature that is less than or equal to its critical temperature ($T_c$) and greater than or equal to about 2.2K.

13. The transistor of claim 9, wherein the superconducting bridge has a temperature that is less than or equal to its critical temperature ($T_c$) and greater than or equal to about 3K.

14. The transistor of claim 9, wherein the superconducting bridge has a temperature that is less than or equal to its critical temperature ($T_c$) and greater than or equal to about 5K.

15. The transistor of claim 1 having a frequency response about equal to the recombination of Cooper pairs for the superconducting bridge material being utilized.

16. The transistor of claim 10, wherein the frequency response is between about 0.7 THz and about 1.25 THz.

17. A logic gate comprised using one or more transistors of claim 1.

18. A first transistor of claim 1 and a second transistor of claim 1, wherein the magnetic field signal and the magnetic field bias cause the first transistor to emit a photon and a conductivity of the second transistor is varied based on the emitted photon.

19. The transistor of claim 9, wherein the superconducting bridge comprises niobium and/or niobium alloys.

20. The transistor of claim 11, wherein the superconducting bridge comprises niobium and/or niobium alloys.

21. The first and second transistors of claim 18, wherein the first and second transistors are configured such that a quantum state between the first and second transistors is entangled.

22. The first and second transistors of claim 21, where the first and second transistors form a logic gate.

23. The transistor of claim 4, wherein the magnitude of $H_a$ and $H_{sig}$, combined, is equal to $H_c$ and the superconductor bridge is normal.

24. A superconducting Meissner effect transistor comprising: a superconducting bridge between a first and a second current probe, the first and second current probe being electrically connected to a source and a drain electrical connection, respectively; and
a control line configured to emit a magnetic field signal having signal strength $H_{sig}$ at the superconducting bridge, wherein the emitted magnetic field is configured to break Cooper pairs in the superconducting bridge,
wherein the superconducting bridge comprises niobium and/or niobium alloys and the frequency response of the transistor is between about 0.7 THz and about 1.25 THz.

* * * * *